(12) United States Patent
Bendixen et al.

(10) Patent No.: US 8,729,963 B2
(45) Date of Patent: May 20, 2014

(54) ASYMMETRICAL TRANSFORMER OUTPUT DEMULTIPLEXING (ATODEM) CIRCUIT

(75) Inventors: Jeppe Korshøj Bendixen, Vrå (DK); Ruediger Bauder, Feldkirchen-Westerham (DE)

(73) Assignee: RF Micro Devices, Inc., Greensboro, NC (US)

( * ) Notice: Subject to any disclaimer, the term of this patent is extended or adjusted under 35 U.S.C. 154(b) by 349 days.

(21) Appl. No.: 13/247,085

(22) Filed: Sep. 28, 2011

(65) Prior Publication Data

US 2012/0201258 A1 Aug. 9, 2012

Related U.S. Application Data

(60) Provisional application No. 61/441,009, filed on Feb. 9, 2011.

(51) Int. Cl.
*H03F 1/00* (2006.01)

(52) U.S. Cl.
USPC ............................................ 330/195; 330/165

(58) Field of Classification Search
USPC .......................................... 330/195, 165, 276
See application file for complete search history.

(56) References Cited

U.S. PATENT DOCUMENTS

| | | | | |
|---|---|---|---|---|
| 4,270,061 | A | * | 5/1981 | Gronner et al. ................ 327/319 |
| 5,247,264 | A | * | 9/1993 | Cripe ............................ 330/251 |
| 7,343,138 | B2 | | 3/2008 | Bengtson et al. |
| 8,604,874 | B2 | | 12/2013 | Bendixen |
| 2003/0128071 | A1 | | 7/2003 | Nguyen et al. |
| 2006/0006950 | A1 | | 1/2006 | Burns et al. |
| 2008/0117894 | A1 | | 5/2008 | McMorrow |
| 2010/0328968 | A1 | * | 12/2010 | Adragna et al. ........... 363/21.02 |
| 2011/0310775 | A1 | | 12/2011 | Khlat et al. |
| 2014/0016517 | A1 | | 1/2014 | Khlat et al. |

OTHER PUBLICATIONS

Aoki, I. et al., "A fully-integrated 1.8-V, 2.8-W, 1.9-GHz, CMOS Power Amplifier," IEEE Radio Frequency Integrated Circuits Symposium, Jun. 2003, pp. 199-202.
An, K. et al., "Power-combining transformer techniques for fully-integrated CMOS power amplifiers," IEEE Journal of Solid-State Circuits, vol. 43, No. 5, May 2008, pp. 1034-1075.
Jang, J. et al., "A CMOS RF power amplifier using an off-chip transmission line transformer with 62% PAE," IEEE Microwave and Wireless Components Letters, vol. 17, No. 5, May 2007, pp. 385-387.
Lee, H. et al., "A quasi-four-pair class-E CMOS RF power amplifier with an integrated passive device transformer," IEEE Transactions on Microwave Theory and Techniques, vol. 57, No. 4, Apr. 2009, pp. 752-759.

(Continued)

*Primary Examiner* — Henry Choe
(74) *Attorney, Agent, or Firm* — Withrow & Terranova, P.L.L.C.

(57) ABSTRACT

An asymmetrical transformer output demultiplexing (ATODEM) circuit is disclosed. The ATODEM circuit of the present disclosure includes N input windings, wherein N is a natural number. Each of the N input windings have input terminals that couple to output terminals of N PAs. The ATODEM further includes M output ports wherein M is a natural number, each of the M output ports having N series coupled windings coupled between a load terminal and a return terminal. The physical attributes of the N input windings, and the N series coupled windings of the M output ports are asymmetrical such that in an Nth operation mode an Nth PA first-load line impedance matches an output impedance of an Nth PA coupled to the input terminals.

25 Claims, 14 Drawing Sheets

(56) References Cited

OTHER PUBLICATIONS

Park, C. et al., "Tournament-shaped magnetically coupled power-combiner architecture for RF CMOS power amplifier," IEEE Transactions on Microwave Theory and Techniques, vol. 55, No. 10, Oct. 2007, pp. 2064-2042.

Park, C. et al., "A 1/9-GHz CMOS power amplifier using three-port asymmetric transmission line transformer for a polar transmitter," IEEE Transactions on Microwave Theory and Techniques, vol. 55, No. 2, Feb. 2007, pp. 230-238.

* cited by examiner

ASYMMETRICAL TRANSFORMER OUTPUT DEMULTIPLEXING (ATODEM) CIRCUIT

RELATED APPLICATIONS

This application claims the benefit of provisional patent application Ser. No. 61/441,009, filed Feb. 9, 2011, the disclosure of which is hereby incorporated herein by reference in its entirety.

FIELD OF THE DISCLOSURE

The present disclosure relates to a transformer circuit for switching between various modes of multi-mode and multi-band power amplifiers (PAs).

BACKGROUND

Multi-mode and multi-band power amplifiers (PAs) typically have a mode switch or a band switch that is used to select between modes or between bands. Mode switches and band switches add costs and insertion losses that are detrimental to the economics and the performance of the multi-mode and multi-band PAs. Another efficiency loss is due to a constraint of a single load-line for typical multi-mode and multi-band PAs. The single load-line can only be optimized for one mode or one band of operation. Usually, the single load-line is adjusted to provide a best comprise in performance between various modes and bands of operation. However, even the best comprise for the single load-line results in less than desirable inefficiencies that limit operation time of battery operated user equipment (UE) such as mobile terminals. As such, there is a need to replace the mode switch and/or band switch for multi-mode and multi-band PAs with a switching structure that has reduced insertion losses as well as multiple load-lines that are optimized for individual modes and/or bands of operation.

SUMMARY

The present disclosure provides an asymmetrical transformer output demultiplexing (ATODEM) circuit. The present ATODEM circuit exploits unique advantages of differential power amplifiers (PAs) that have transformer outputs that allow simultaneous load-line matching and collector biasing. One advantage that the differential PA has over an ordinary PA is that a load-line transformation is accomplished directly through a transformer stage coupled to the transformer outputs of the differential PA. The present ATODEM circuit provides transformer stages that can be coupled to the transformer outputs of the differential PAs. Signal demultiplexing provided by the ATODEM circuit works by canceling out correlated and evenly split portions of a de-selected signal having opposite phases while summing correlated and evenly split in-phase portions of a selected signal. A phase alternating circuit that is responsive to a control signal is placed before the ATODEM circuit and in the path of correlated and evenly split in-phase portion of the signals to be selected and deselected. A selected signal is output from the ATODEM circuit.

In general, the ATODEM of the present disclosure includes N input windings, wherein N is a natural number. Each of the N input windings have input terminals that couple to output terminals of N PAs. The ATODEM further includes M output ports wherein M is a natural number, each of the M output ports having N series coupled windings coupled between a load terminal and a return terminal. The physical attributes of the N input windings, and the N series coupled windings of the M output ports are asymmetrical such that in an Nth operation mode an Nth PA first-load line impedance matches an output impedance of an Nth PA coupled to the input terminals.

One embodiment of the ATODEM circuit of the present disclosure includes a first primary winding having first input terminals for receiving a first signal and a second primary winding having second input terminals for receiving a second signal that is correlated with the first signal. Series coupled secondary windings having a common node terminal and a first load terminal, and series coupled tertiary windings having a common node terminal and a second load terminal are also included. A first power amplifier (PA) first load-line impedance is at the first input terminals during a first operation mode that sums in-phase versions of the first signal and the second signal in the series coupled secondary windings to provide a combined first signal and second signal to a first load coupled to the first load terminal. Simultaneously, opposite phase versions of the first signal and the second signal are summed in the series coupled tertiary windings thereby effectively canceling the first signal and the second signal from a second load coupled to the second load terminal. A first PA second load-line impedance is at the first input terminals during a second operation mode that sums opposite phase versions of the first signal and the second signal in the series coupled secondary windings thereby effectively canceling the first signal and the second signal from the first load coupled to the first load terminal. At the same time, in-phase versions of the first signal and the second signal are summed together in the series coupled tertiary windings thereby providing a combined first signal and second signal to the second load coupled to the second load terminal. A second PA first load-line impedance is at the second input terminals during the first operation mode and a second PA second load-line impedance is at the second input terminals during the second operation mode.

Physical attributes of the first primary winding, the second primary winding, the series coupled secondary windings, and the series coupled tertiary windings are asymmetrical such that the first PA first load-line impedance matches an output impedance of a first PA coupled to the first input terminals, and the second PA second load-line impedance matches an output impedance of a second PA coupled to the second input terminals.

In one embodiment, fine tuning of the first PA first load-line impedance and the first PA second load-line impedance is accomplished using a first programmable array of capacitors (PAC) coupled between the first load terminal and the first load. Similarly, fine tuning of the second PA first load-line impedance and the second PA second load-line impedance is accomplished using a second PAC coupled between the second load terminal and the second load.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
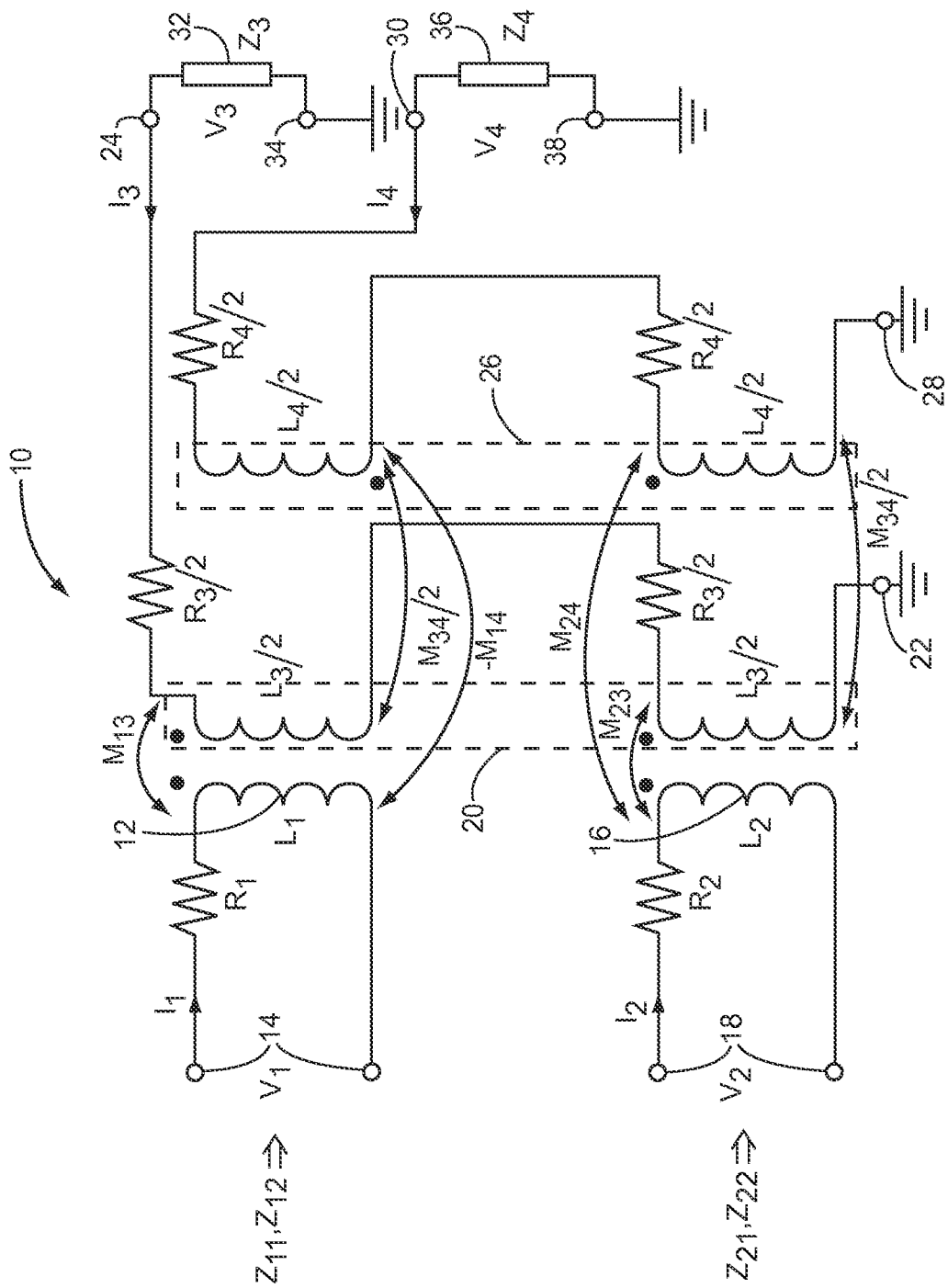
FIG. 1 is a circuit diagram of an asymmetric transformer output demultiplexing (ATODEM) circuit according to the present disclosure.

FIG. 1 is a circuit diagram of an asymmetric transformer output demultiplexing (ATODEM) circuit 10 according to the present disclosure. The ATODEM circuit 10 includes a first primary winding 12 having first input terminals 14 for receiving a first signal $V_1$. The first primary winding 12 is electrically modeled by a series resistance $R_1$ and an inductance $L_1$. A signal current $I_1$ flows through the first primary winding 12 in response to the first signal $V_1$.

Also included is a second primary winding 16 having second input terminals 18 for receiving a second signal $V_2$ that is correlated with the first signal $V_1$. The second primary winding 16 is electrically modeled by a series resistance $R_2$ and an inductance $L_2$. A signal current $I_2$ flows through the second primary winding 16 in response to the second signal $V_2$.

The ATODEM circuit 10 further includes series coupled secondary windings 20 having a common node terminal 22 and a first load terminal 24. The common node terminal 22 is coupled to a voltage node such as ground. The series coupled secondary windings 20 are electrically modeled by a series resistor $R_3$ and an inductance $L_3$ that are divided between series coupled secondary windings 20. A first mutual inductance M13 models a magnetic coupling between the first primary winding 12 and an adjacent one of the series coupled secondary windings 20. A second mutual inductance M23 models a magnetic coupling between the second primary winding 16 and an adjacent one of the series coupled secondary windings 20. A signal current $I_3$ flows through the series coupled secondary windings 20 in response to the first signal $V_1$ and in response to the second signal $V_2$.

Series coupled tertiary windings 26 have a common node terminal 28 and a second load terminal 30 are also included in ATODEM circuit 10. The common node terminal 28 is coupled to a voltage node such as ground. The series coupled tertiary windings 26 are electrically modeled by a series resistor R4 and an inductance L4 that are divided between series coupled tertiary windings 26. A third mutual inductance –M14 models a magnetic coupling between the first primary winding 12 and an adjacent one of the series coupled tertiary windings 26. The third mutual induction –M14 is assigned a negative sign because the series coupled secondary windings 20 are magnetically opposed as shown by dot notation in FIG. 1. A fourth mutual inductance M24 models a magnetic coupling between the second primary winding 16 and an adjacent one of the series coupled tertiary windings 26. A fifth mutual inductance M34 models a magnetic coupling between the series coupled secondary windings 20 and the series coupled tertiary windings 26. A signal current $I_4$ flows through the series coupled tertiary windings 26 in response to the first signal $V_1$ and in response to the second signal $V_2$.

A first power amplifier (PA) first load-line impedance $Z_{11}$ is present at the first input terminals 14 during a first operation mode that sums in-phase versions of the first signal $V_1$ and the second signal $V_2$ induced in the series coupled secondary windings 20. A combined first signal $V_1$ and a second signal $V_2$ is provided to a first load 32 coupled to the first load terminal 24. For example, a first output signal $V_3$ equals the sum of the first signal $V_1$ and the second signal $V_2$ during the first operation mode. The first load 32 is modeled electrically by an impedance $Z_3$.

Simultaneously, opposite phase versions of the first signal $V_1$ and the second signal $V_2$ induced in the series coupled tertiary windings 26 are effectively canceled from a second load 36 coupled to the second load terminal 30. The second load 36 has a common node terminal 38 that is coupled to a voltage node as ground. The second load 36 is modeled electrically by an impedance $Z_4$.

A first PA second load-line impedance $Z_{12}$ is at the first input terminals 14 during a second operation mode that sums opposite phase versions of the first signal $V_1$ and the second signal $V_2$ in the series coupled secondary windings 20 thereby effectively canceling the first signal $V_1$ and the second signal $V_2$ from the first load 32. Simultaneously, in-phase versions of the first signal $V_1$ and the second signal $V_2$ induced in the series coupled tertiary windings 26 are summed such that a combined first signal $V_1$ and second signal $V_2$ is provided to the second load 36. For example, a second output voltage $V_4$ equals the sum of the first signal $V_1$ and the second signal $V_2$ during the second operation mode. A second PA first load-line impedance $Z_{21}$ is at the second input terminals 18 during the first operation mode and a second PA second load-line impedance $Z_{22}$ is at the second input terminals 18 during the second operation mode.

A matrix defined in equation (1) below represents a simplified basic functionality of the ATODEM circuit 10. The matrix of equation (1) ignores parasitic resistances, inductances, and capacitances and also assumes that the mutual inductance $M_{34}$ is approximately equal to zero. Moreover, the matrix of equation (1) assumes that the mutual inductance $M_{13}$ and the mutual inductance $M_{23}$ are approximately equal. Further still, the matrix of equation 1 assumes that the magnitudes of the mutual inductance $-M_{14}$ and the inductance $M_{24}$ are approximately equal. Other matrices that are usable in place of equation (1) can be developed by those skilled in the art to account for various parasitic resistances, inductances, and capacitances without deviating from the scope of the present disclosure.

$$\begin{bmatrix} V_1 \\ V_2 \\ V_3 \\ V_4 \end{bmatrix} = \begin{bmatrix} R_1 + j\omega L_1 & 0 & j\omega M_{13} & -j\omega M_{14} \\ 0 & R_2 + j\omega L_2 & j\omega M_{23} & j\omega M_{24} \\ j\omega M_{13} & j\omega M_{23} & R_3 + j\omega L_3 & j\omega M_{34} \\ -j\omega M_{14} & j\omega M_{24} & j\omega M_{34} & R_4 + j\omega L_4 \end{bmatrix} \begin{bmatrix} I_1 \\ I_2 \\ I_3 \\ I_4 \end{bmatrix}. \quad (1)$$

The matrix of equation (1) is usable to solve for the first PA first load-line impedance $Z_{11}$ according to equation (2), the first PA second load-line impedance $Z_{12}$ according to equation (3), the second PA first load-line impedance $Z_{21}$ according to equation (4), and the second PA second load-line impedance $Z_{22}$ according to equation (5). A phase angle $\phi$ represents the relative phase difference between the first signal $V_1$ and the second signal $V_2$.

$$Z_{11} = R_1 + j\omega L_1 + \frac{2\omega^2 M_{13}^2}{R_3 + j\omega L_3 + Z_3} \text{ for the first operation mode,} \quad (2)$$
$$\varphi = 0.$$

$$Z_{12} = R_1 + j\omega L_1 + \frac{2\omega^2 M_{14}^2}{R_4 + j\omega L_4 + Z_4} \text{ for the second operation mode,} \quad (3)$$
$$\varphi = \pi.$$

$$Z_{21} = R_2 + j\omega L_2 + \frac{2\omega^2 M_{13}^2}{R_3 + j\omega L_3 + Z_3} \text{ for the first operation mode,} \quad (4)$$
$$\varphi = 0.$$

$$Z_{22} = R_2 + j\omega L_2 + \frac{2\omega^2 M_{14}^2}{R_4 + j\omega L_4 + Z_4} \text{ for the second operation mode,} \quad (5)$$
$$\varphi = \pi.$$

Inductances $L_1$, $L_2$, $L_3$, $L_4$, and resistances $R_1$, $R_2$, $R_3$, $R_4$ as well as mutual inductances $M_{13}$ and $M_{14}$ are controlled by physical attributes of traces making up the first primary winding 12, the second primary winding 16, the series coupled secondary windings 20 and the series coupled tertiary windings 26. Some physical attributes of the ATODEM circuit 10 include turns ratio between the first primary winding 12 and the second primary winding 16, and turns ratio between the series coupled secondary windings 20 and the series coupled tertiary windings 26. Other physical attributes of the ATO-DEM circuit 10 include trace dimensions and trace geometries of the first primary winding 12, the second primary winding 16, the series coupled secondary windings 20, and the series coupled tertiary windings 26. The trace dimensions include trace length width and thickness. Trace geometries include trace radius of curvature and relative spacing between traces. The relative spacing between traces includes horizontal, vertical, and lateral spacing.

Figure 2A:
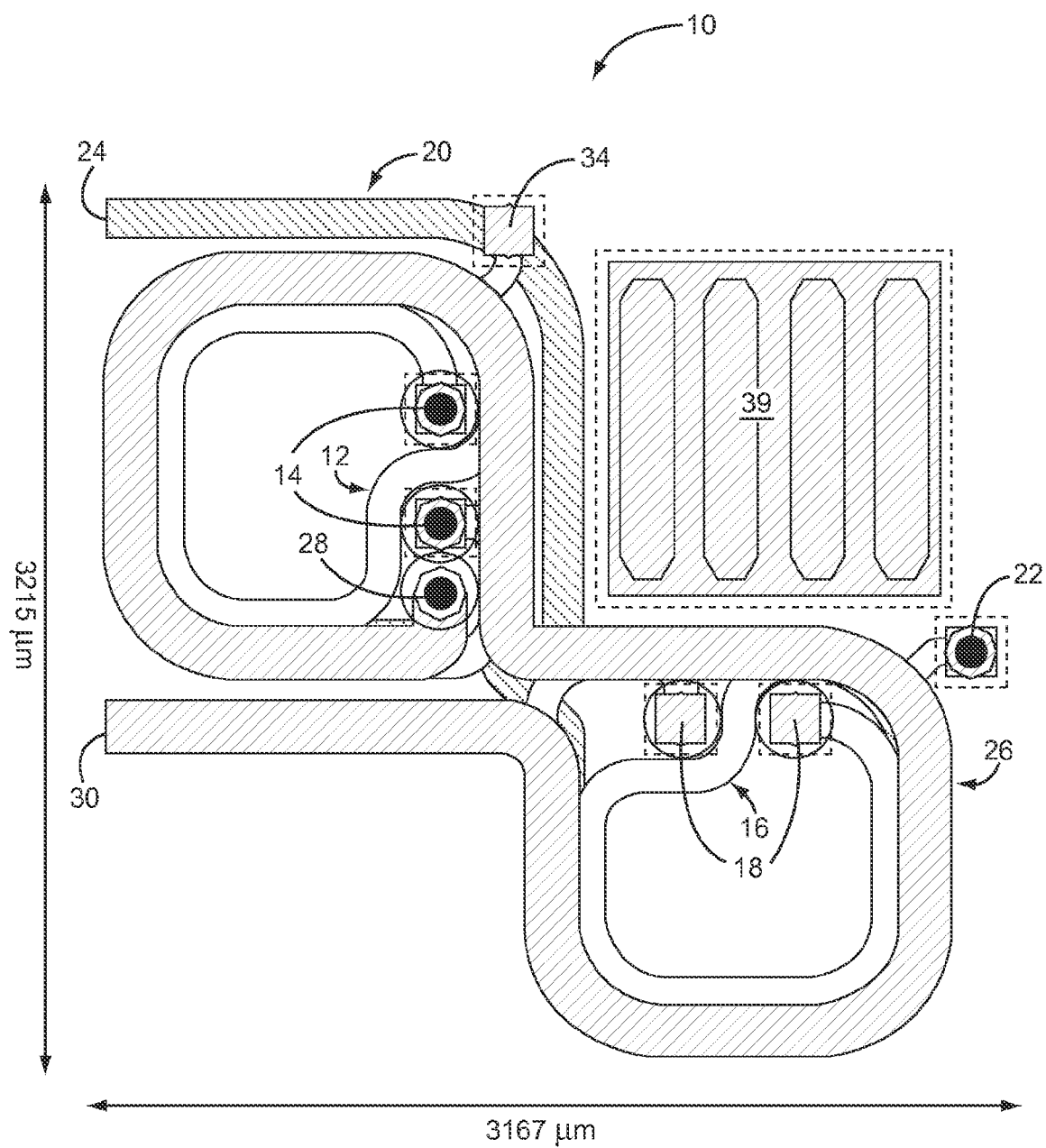
FIG. 2A is a planer view of a physical layout for metal layers of the ATODEM circuit of FIG. 1.

FIG. 2A is a planer view of a physical layout of an exemplary embodiment of the ATODEM circuit 10 (FIG. 1). In this exemplary embodiment, the ATODEM circuit 10 is fabricated using five layers in a substrate such as, but not limited to, Silicon-on-insulator (SOI), Gallium Arsenide (GaAs), glass or a coreless substrate known as CX50. The exemplary embodiment of ATODEM circuit 10 is relatively small, having a length of 3215 µm and a width of 3167 µm.

Figure 2B:
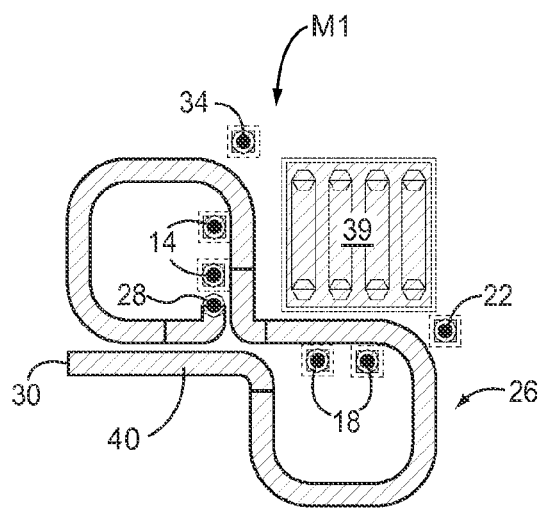
FIG. 2B is a planar view of the physical layout of a series coupled tertiary windings formed in a first metal layer.
Figure 2C:
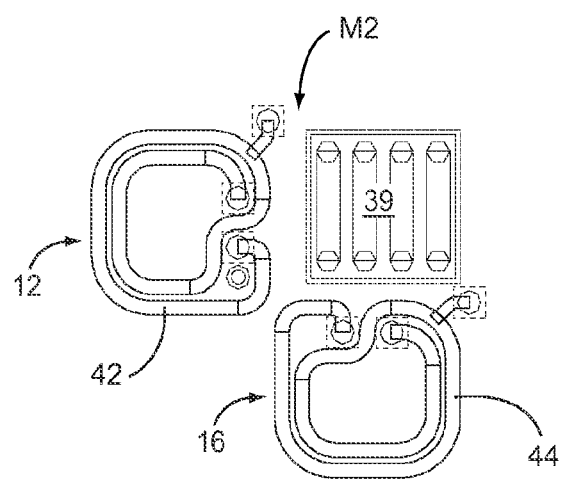
FIG. 2C is a planar view of the physical layout of a first primary winding and a second primary winding that are both formed in a second metal layer.
Figure 2D:
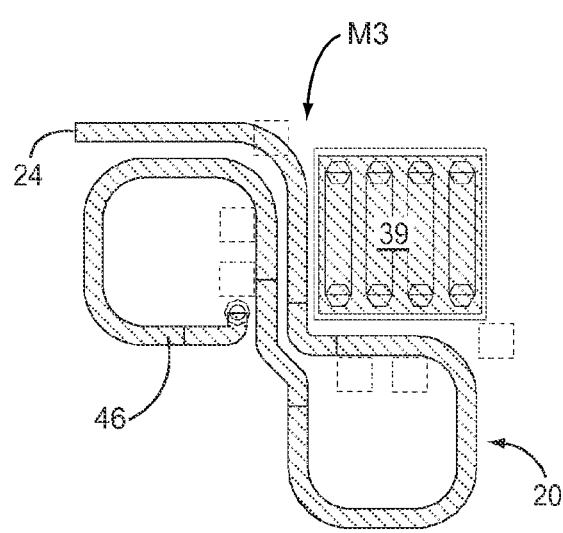
FIG. 2D is a planar view of the physical layout of a series coupled secondary windings formed in a third metal layer.

As best seen in FIG. 2B through 2D, a first metal layer M1, a second metal layer M2, and a third metal layer M3 are used to fabricate the ATODEM circuit 10. A fourth metal layer M4 (not shown) is used as spacing to a reference ground formed in a fifth metal layer M5 (not shown). A ground die flag 39 is formed in the first metal layer M1, the second metal layer M2, and the third metal layer M3.

FIG. 2B is a planar view of the physical layout of the series coupled tertiary windings 26 formed from a trace 40 in the first metal layer M1. In this exemplary embodiment, the series coupled tertiary windings 26 have a single turn.

FIG. 2C is a planar view of the physical layout of the first primary winding 12 and the second primary winding 16 formed from a trace 42 and a trace 44 in the second metal layer M2. In this exemplary embodiment, the first primary winding 12 and the second primary winding 16 each have two turns.

FIG. 2D is a planar view of the physical layout of the series coupled secondary windings 20 formed from a trace 46 in the third metal layer M3. In this exemplary embodiment, the series coupled secondary windings 20 have a single turn.

Figure 3A:
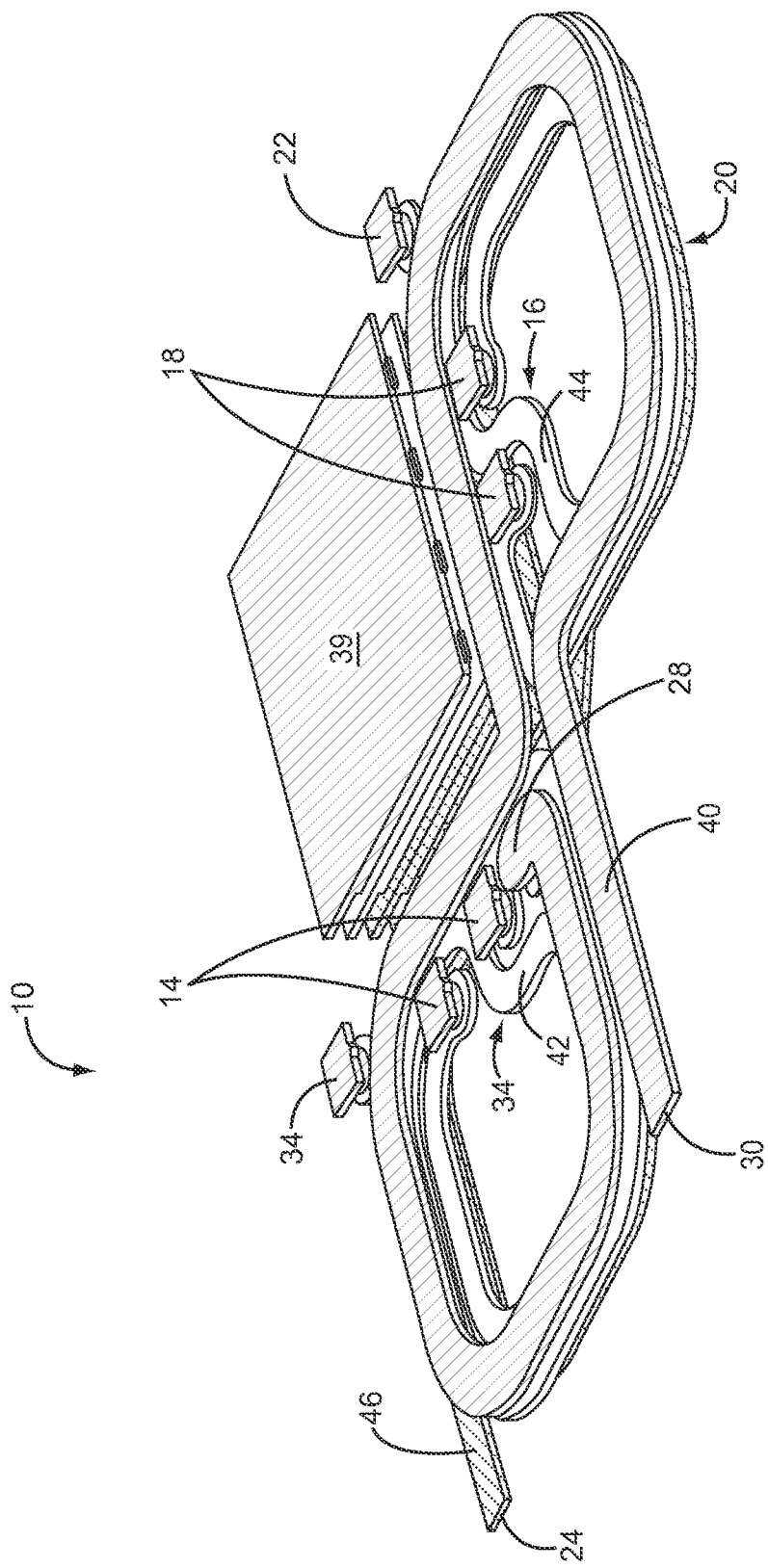
FIG. 3A is a perspective view of the physical layout for metal layers with the first metal layer being in proximal view.
Figure 3B:
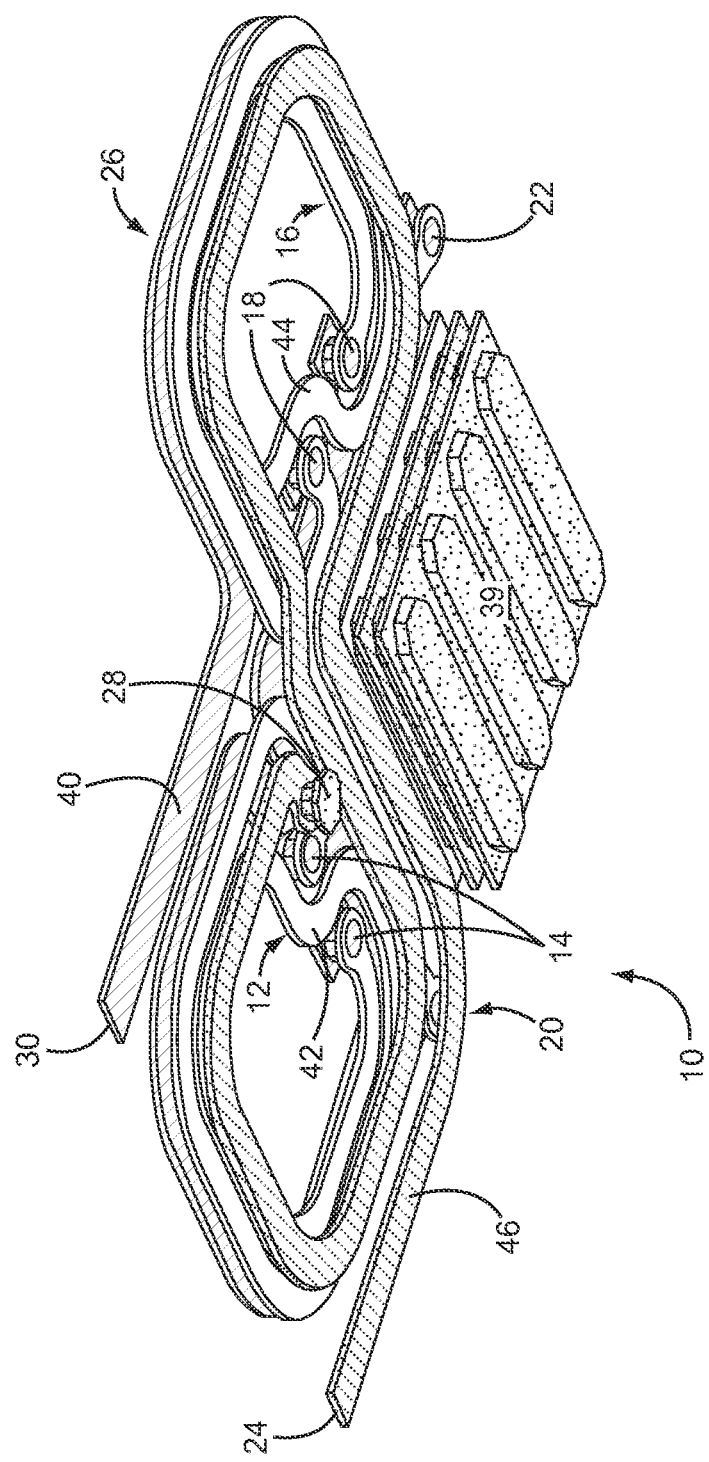
FIG. 3B is a perspective view of the physical layout for metal layers with the third metal layer being in proximal view.

FIG. 3A is a perspective view of the physical layout of the ATODEM circuit 10 with the first metal layer M1 being in proximal view. FIG. 3B is a perspective view of the physical layout of the ATODEM circuit 10 with the third metal layer M3 being in proximal view.

It is desirable for the first PA first load-line impedance $Z_{11}$, the first PA second load-line impedance $Z_{12}$, the second PA first load-line impedance $Z_{21}$, and the second PA second load-line impedance $Z_{22}$ to be dynamically fine tuned to provide a desired power added efficiency (PAE). Dynamic fine tuning can be accomplished via a programmable array of capacitors (PAC).

Figure 4:
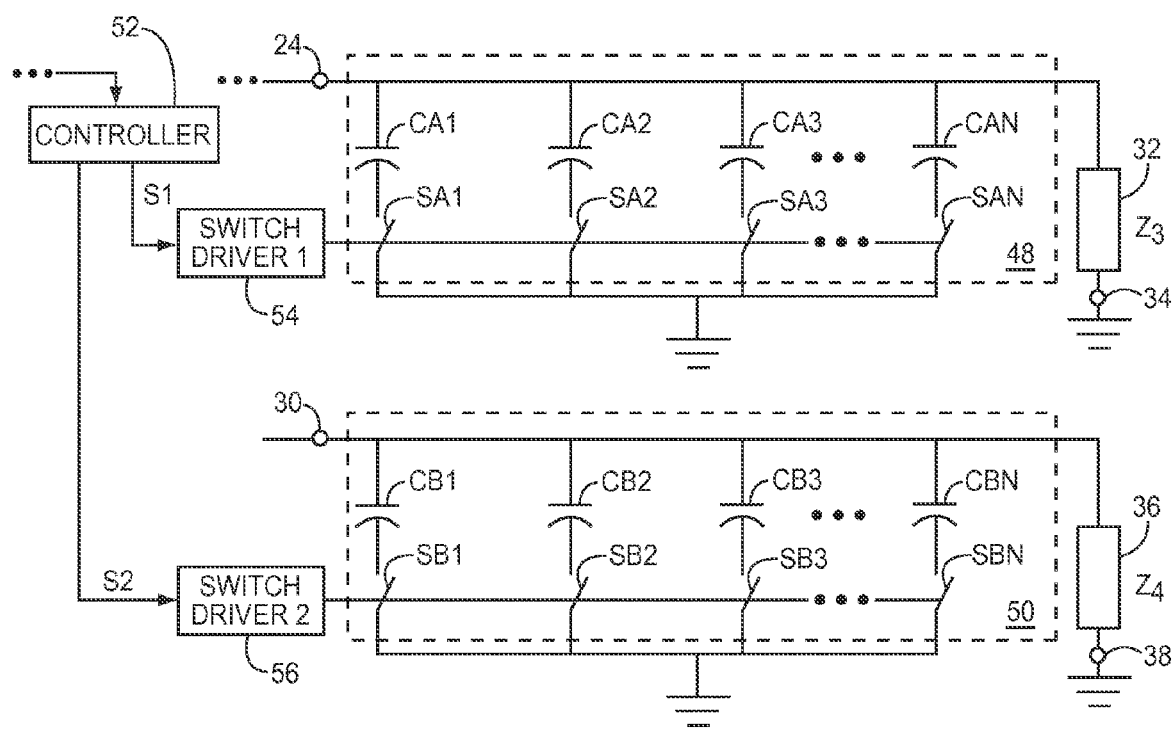
FIG. 4 is a circuit schematic depicting programmable capacitor arrays (PAC) that are usable for fine tuning load-line impedance.

FIG. 4 depicts a first PAC 48 comprising capacitors CA1-CAN and a second PAC 50 comprising capacitors CB1-CBN. Switches SA1-SAN are controllable via a switch controller 52 that outputs a first signal 51 to a first switch driver 54 for switching individual ones of the capacitors CA1-CAN in and out of parallel with the first load 32. Switches SB1-SBN are controllable via the switch controller 52 that outputs a second signal S2 to a second switch driver 56 for switching individual ones of the capacitors CB1-CBN in and out of parallel with the second load 36.

In response to either the first operation mode or the second operation mode, a control system (not shown) issues commands to the switch controller 52 which in turn sends the first signal 51 to the first switch driver 54 and/or the second signal S2 to the second switch driver 56. For example, the first operation mode can be the second generation (2G) mode wherein the first PAC 48 can be controlled such that the first PA first load-line impedance can be varied up to 10Ω at fixed frequency of 869.5 MHz.

Figure 5:
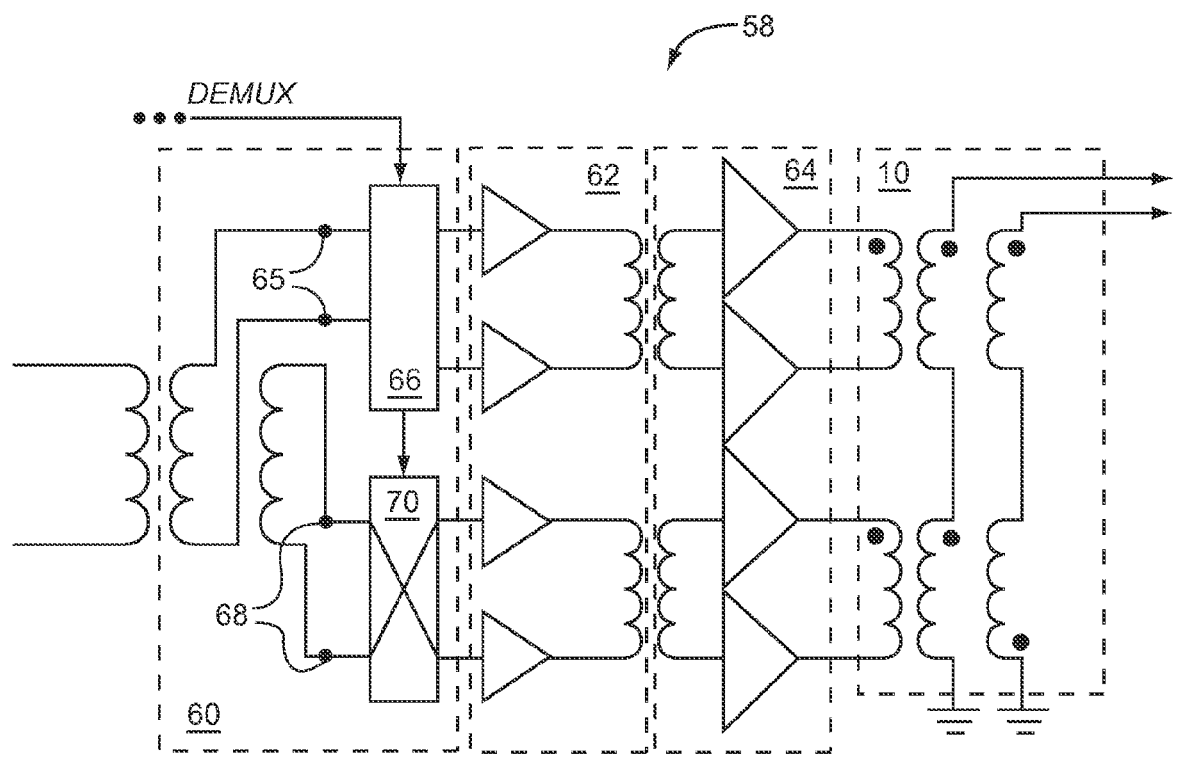
FIG. 5 is a circuit diagram of a power amplifier (PA) system having a phase alternating circuit placed before a PA coupled to the ATODEM circuit of the present disclosure.

FIG. 5 is a circuit diagram of a PA system 58 having a phase alternating circuit 60 placed before a first PA stage 62 and a final PA stage 64 coupled to the ATODEM circuit 10. The phase alternating circuit 60 includes a first pair of differential terminals 65 that can be selectively crisscrossed by a first multiplexer switch 66 and a second pair of differential terminals 68 that can be selectively crisscrossed by a second multiplexer switch 70. A selection of either of the first pair of differential terminals 65 and the second pair of differential terminals 68 is performed in response to a control signal DEMUX. In FIG. 5, the second pair of differential terminals 68 is shown crisscrossed. In some embodiments, the first multiplexer switch 66 or the second multiplexer switch 70 can be replaced by a delay device (not shown) that has a propagation delay that is equal to an inherent propagation delay of whichever of the first multiplexer switch 66 and the second multiplexer switch 70 is being replaced.

Correlated signals that are to be demultiplexed by the ATODEM circuit 10 are generated before the phase alternating circuit 60. These correlated signals include transceiver TX signals, transceiver noise, and PA noise. Uncorrelated signals will experience the ATODEM circuit 10 as a power splitter. The uncorrelated signals are generated after the phase alternating circuit 60. As a result, the PA system 58 will likely fail some desirable sensitivity targets without using Silicon-on-insulator (SOI) switch technology or other types of high isolation switch technology for the first multiplexer switch 66 and the second multiplexer switch 70. However, SOI switch technology provides a relatively high isolation of 35 dBm which provides enough isolation to meet the desirable sensitivity targets.

Figure 6:
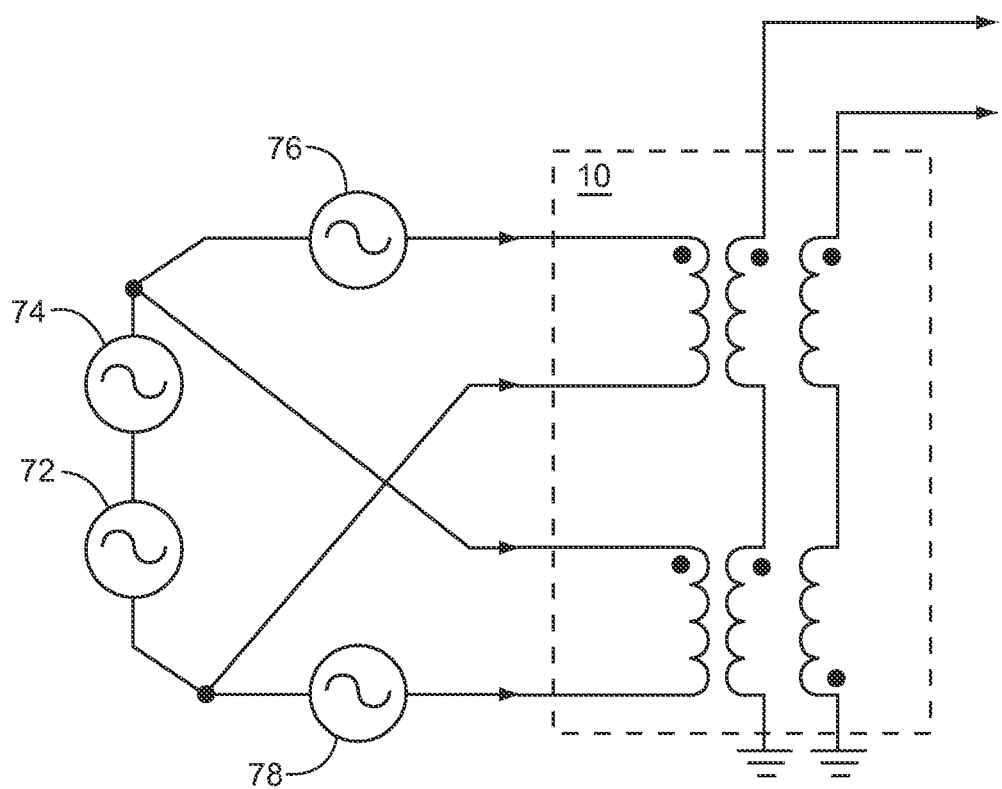
FIG. 6 is a circuit diagram that shows an example of a correlated signal source, a correlated noise source, a first uncorrelated noise source and a second uncorrelated noise source.

FIG. 6 is a circuit diagram that shows an example of correlated signal source 72, a correlated noise source 74, a first uncorrelated noise source 76, and a second uncorrelated noise source 78. The uncorrelated noise source 76 and the uncorrelated noise source 78 can be within the first PA stage 62.

Figure 7:
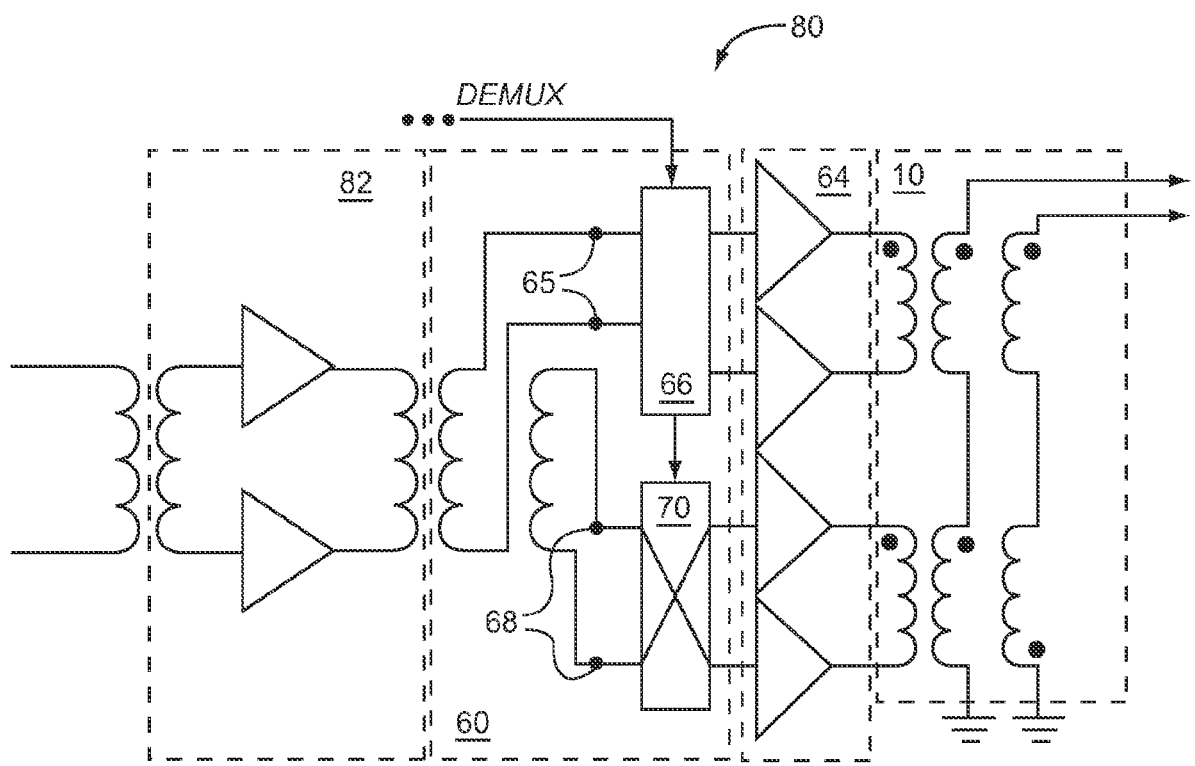
FIG. 7 is a circuit diagram of a PA system that is configured to minimize uncorrelated noise produced by uncorrelated noise sources without the need for Silicon-on-insulator (SOI) switch technology.

FIG. 7 is a circuit diagram of a PA system 80 that is configured to minimize uncorrelated noise produced by the uncorrelated noise source 76 (FIG. 6) and the uncorrelated noise source 78 (FIG. 6) without the need for SOI switch technology. In the PA system 80, the phase alternating circuit 60 is coupled directly to the final PA stage 64 so that pre-amplification stages such as a pre-amplifier stage 82 will be located before the phase alternating circuit 60. In this way, uncorrelated noise from the pre-amplifier stage 82 is minimized to a point that desirable sensitivity targets are met without employing SOI switch technology. However, employing SOI switch technology for the first multiplexer switch 66 and the second multiplexer switch 70 will provide even greater performance with regard to meeting desirable sensitivity targets.

Figure 8:
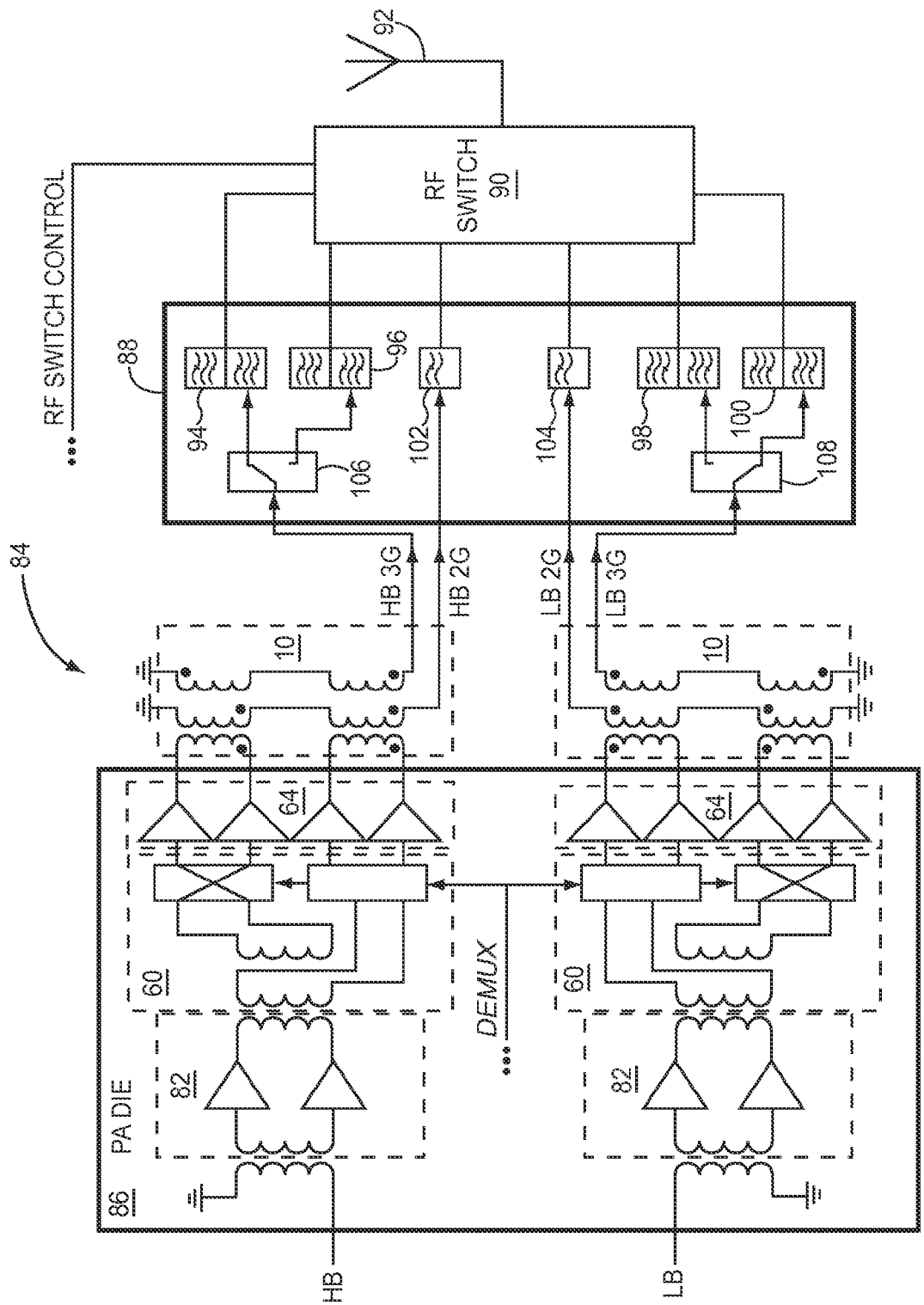
FIG. 8 is a circuit diagram of a PA system that incorporates ATODEM circuits for providing a quad band Universal Mobile Telecommunications System (UMTS) mode and a quad mode Global System Mobile Communications (GSM), General Packet Radio Service (GPRS), Enhanced Data rates for Global Evolution (EDGE).

FIG. 8 is a circuit diagram of a PA system 84 that includes a pair of the ATODEM circuit 10 for providing a quad band Universal Mobile Telecommunications System (UMTS) mode and a quad mode Global System Mobile Communications (GSM), General Packet Radio Service (GPRS), Enhanced Data rates for Global Evolution (EDGE) mode. In FIG. 8, like numbers refer to like elements. Pairs of the phase alternating circuit 60, the final PA stage 64 and the pre-amplifier stage 82 are integrated in a PA die 86. The pair of the ATODEM circuit 10 is coupled to the PA die 86. A duplexer block 88 is coupled between the pair of the ATODEM circuit 10 and an RF switch 90. An antenna 92 is selectively coupled to the duplexer block 88 via the RF switch 90 in response to an RF SWITCH CONTROL signal.

The duplexer block 88 includes a band 1 duplexer 94, a band 2 duplexer 96, a band 5 duplexer 98 and a band 8 duplexer 100. The duplexer block 88 also includes a high band (HB) second generation (2G) filter 102 and a low band (LB) 2G filter 104. A first single pole double throw (SPDT) 106 selectively switches an HB third generation (3G) signal between the band 1 duplexer 94 and the band 2 duplexer 96. A second SPDT 108 selectively switches an LB 3G signal between the band 5 duplexer 98 and the band 8 duplexer 100.

A worse case for noise generated within the PA system 84 for a band 1 mode includes noise leakage through the band 1 duplexer 94 and noise leakage through the HB 2G path that includes the HB 2G filter 102. A worse case generated noise for a band 2 mode includes noise leakage through a path that includes the first SPDT switch 106. Additional noise can leak through a 2G HB path that includes the HB 2G filter 102.

A worse case for noise generated within the PA system 84 for a band 5 mode includes noise leakage through the band 5 duplexer 98 and noise leakage through a path that includes the second SPDT 108. Additional noise leakage can occur through a 2G path that includes the LB 2G filter 104. A worse case generated noise for a band 8 mode includes noise leakage through a path that includes the band 8 duplexer 100. Additional noise can leak through a 2G LB path that includes the LB 2G filter 104. Nevertheless, the total generated noise projection for the PA system 84 is well within antenna referred target reference sensitivity limits of −106.7 dbm, −104.7 dBm, −107.7 dBm and −103.7 dBm for bands 1, 2, 5 and 8 respectively.

Figure 9:
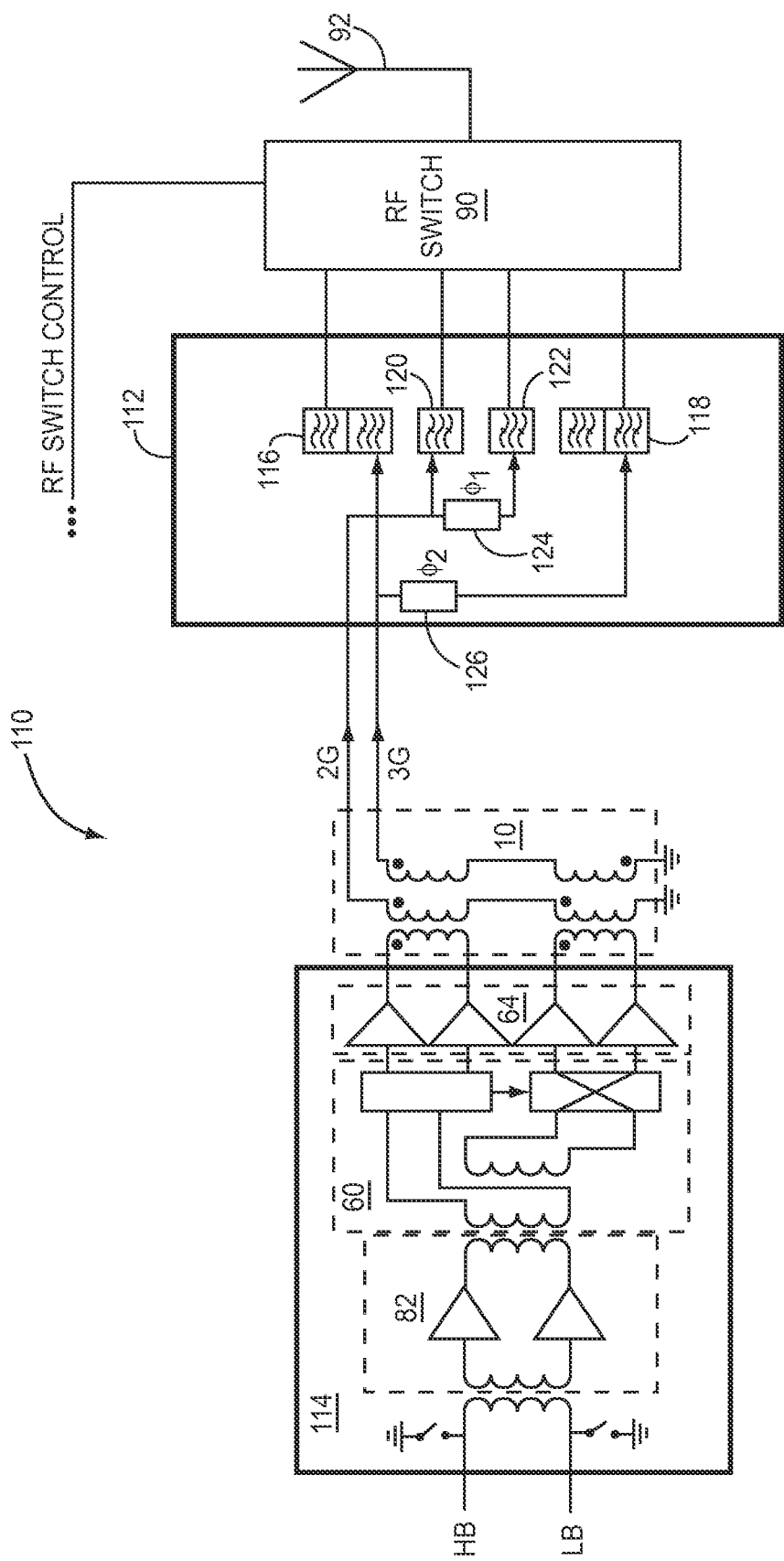
FIG. 9 is a circuit diagram of an exemplary broad band ATODEM and PA system for providing a dual band UMTS as well as a quad band GSM/GPRS/EDGE mode.

FIG. 9 is an exemplary broad band (BB) ATODEM and PA system 110 for providing a dual band UMTS as well as a quad band GSM/GPRS/EDGE mode. The BB ATODEM and PA system 110 include the ATODEM circuit 10, a duplexer block 112, and a PA die 114. The duplexer block 112 includes a first 3G duplexer 116 and a second 3G duplexer 118 as well as a first 2G band-pass filter 120 and a second 2G band-pass filter 122. A first phase shifter 124 is coupled between the first 2G band-pass filter 120 and the second 2G band-pass filter 122 for adjusting a HB/LB load-line. The first phase shifter 124 controls a phase angle $\phi_1$ of an RF signal passing through the first phase shifter 124. A second phase shifter 126 is coupled between the first 3G duplexer 116 and the second 3G duplexer 118. The second phase shifter 126 controls a phase angle $\phi_2$ of an RF signal passing through the second phase shifter 126.

Figure 10:
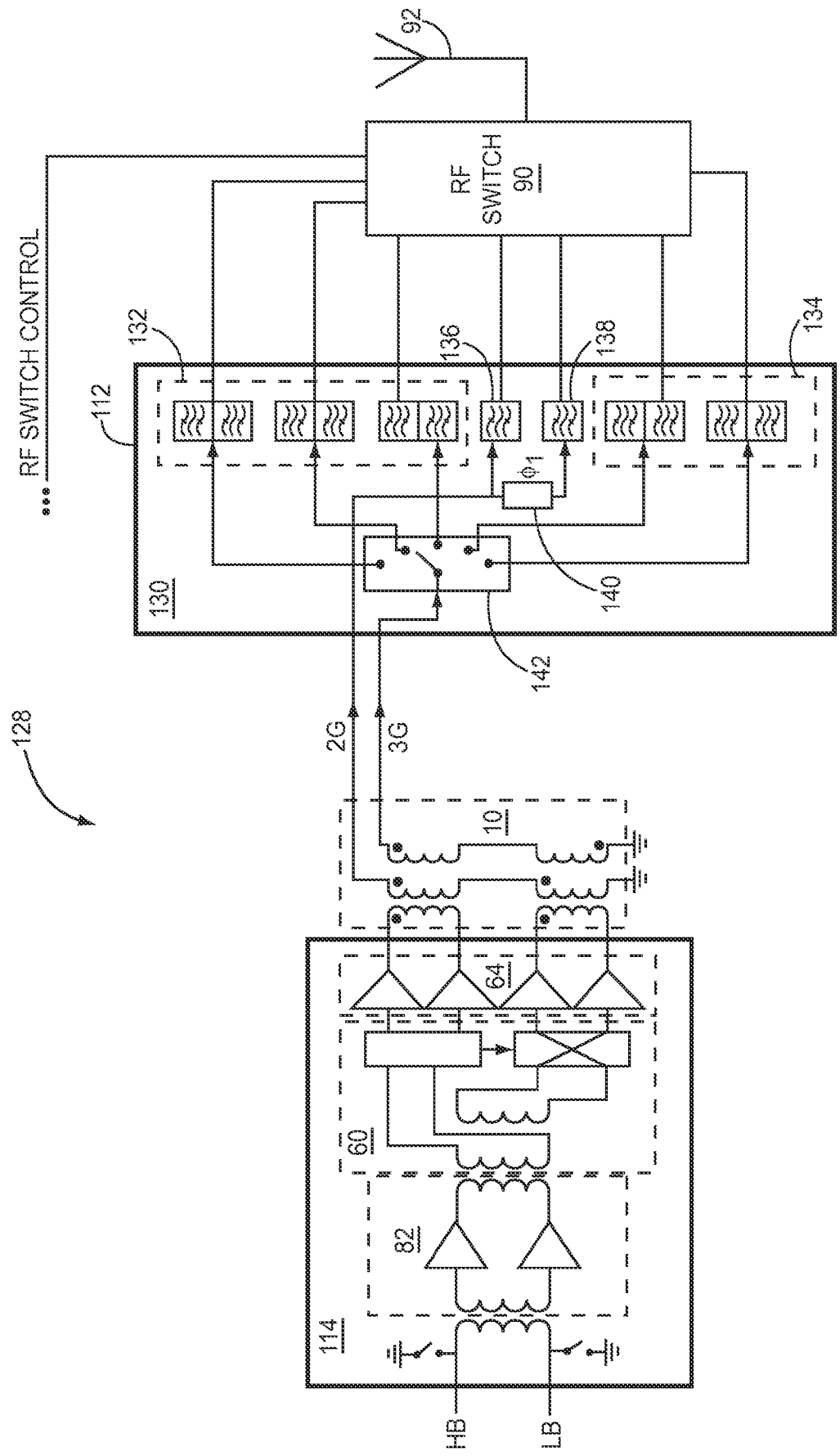
FIG. 10 is a circuit diagram of another exemplary broad band ATODEM and PA system that includes a broad band ATODEM circuit interfaced with a band switch for 5 band UMTS and quad band GSM/GPRS/EDGE mode.

FIG. 10 is a circuit diagram of another exemplary BB ATODEM and PA system 128 that includes the ATODEM circuit 10 for providing 5 band UMTS and quad band GSM/GPRS/EDGE mode. The BB ATODEM and PA system 128 includes a duplexer block 130 and the PA die 114, the ATODEM circuit 10 is coupled between the PA die 114 and the duplexer block 130. The antenna 92 is selectively coupled to the duplexer block 130 through the RF switch 90 in response to the RF SWITCH CONTROL signal. The duplexer block 130 includes 3G HB duplexers 132 and 3G LB duplexers 134 as well as a first 2G band-pass filter 136 and a second 2G band-pass filter 138. A phase shifter 140 is coupled between the first 2G band-pass filter 136 and the 2G second band-pass filter 138. A 3G 5 band switch 142 is included in the duplexer block 130 so that the ATODEM circuit 10 is usable to provide broad band coverage and operation modes for the PA die 114.

Figure 11:
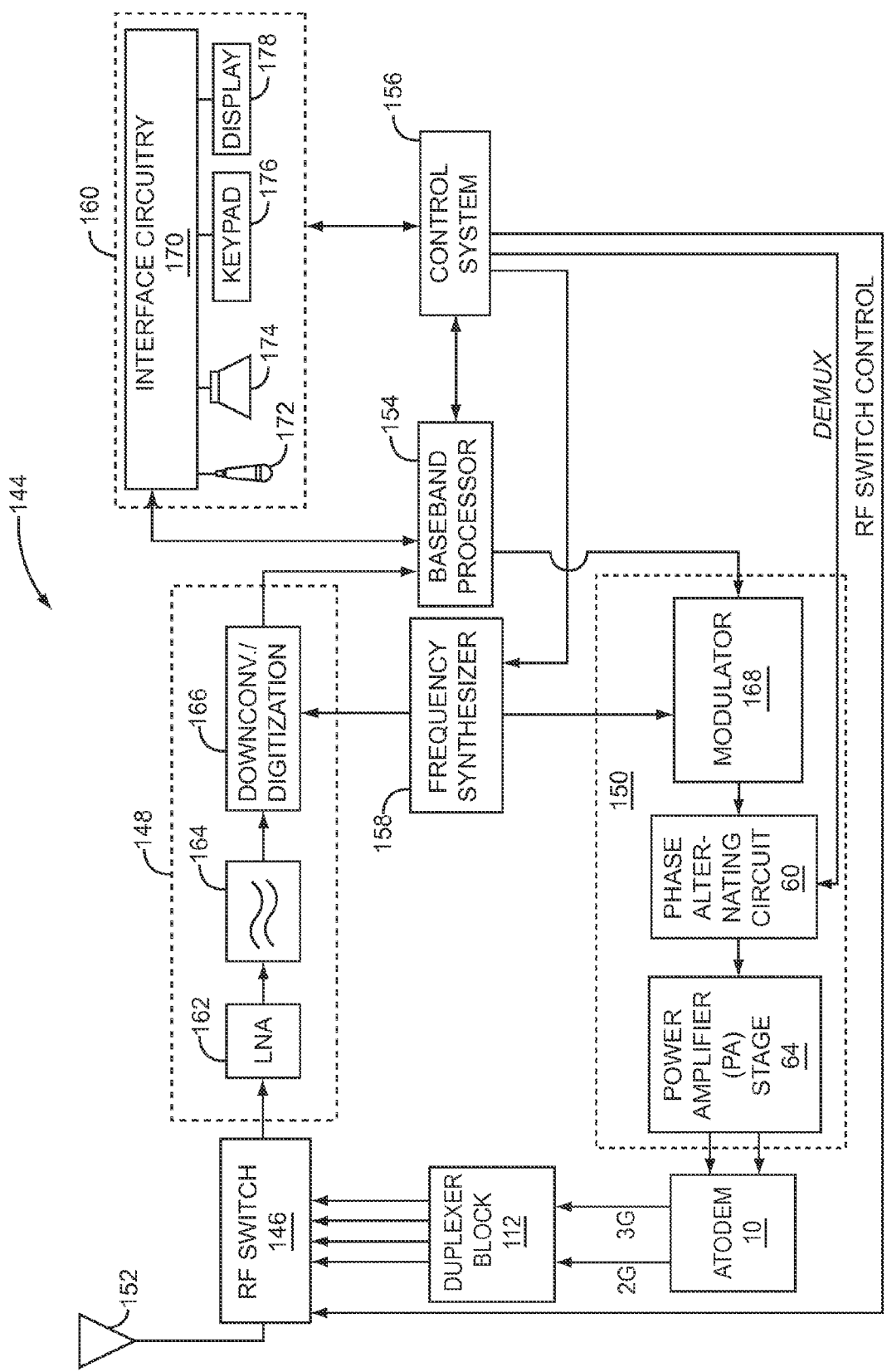
FIG. 11 is a mobile terminal that incorporates an ATODEM circuit according to the present disclosure.

Turning now to FIG. 11, the ATODEM circuit 10 and associated circuitry that includes the phase alternating circuit 60, the PA stage 64 and the duplexer block 112 are incorporated in a mobile terminal 144, such as a cellular handset, a personal digital assistant (PDA), or the like. The basic architecture of the mobile terminal 144 may include an RF switch 146, a receiver front end 148, an RF transmitter section 150, an antenna 152, a baseband processor 154, a control system 156, a frequency synthesizer 158, and an interface 160. The receiver front end 148 receives information bearing RF signals from one or more remote transmitters provided by a base station. A low noise amplifier 162 amplifies the signal. A filter circuit 164 minimizes broadband interference in the received signal, while downconversion and digitization circuitry 166 downconverts the filtered, received signal to an intermediate or baseband frequency signal, which is then digitized into one or more digital streams. The receiver front end 148 typically uses one or more mixing frequencies generated by the frequency synthesizer 158.

The baseband processor 154 processes the digitized received signal to extract the information or data bits conveyed in the received signal. This processing typically comprises demodulation, decoding, and error correction operations. As such, the baseband processor 154 is generally implemented in one or more digital signal processors (DSPs).

On the transmit side, the baseband processor 154 receives digitized data, which may represent voice, data, or control information from the control system 156 which it encodes for transmission. The encoded data is output to the RF transmitter section 150, where it is used by a modulator 168 to modulate a carrier signals that are each at a desired transmit frequency. In response to the DEMUX signal, the phase alternating circuit 60 changes the phase of a division of a modulated carrier signal to be canceled by the ATODEM 10. The PA stage 64 amplifies the modulated carrier signal to a level appropriate for transmission from the antenna 152. The ATODEM 10 demultiplexes the modulated carriers and passes the modulated carrier signal selected for transmission to the duplexer block 112, which in turn filters and passes the selected modulated carrier signal to the RF switch 146.

A user may interact with the mobile terminal 144 via the interface 160, which may include interface circuitry 170 associated with a microphone 172, a speaker 174, a keypad 176, and a display 178. The interface circuitry 170 typically includes analog-to-digital converters, digital-to-analog converters, amplifiers, and the like. Additionally, it may include a voice encoder/decoder, in which case it may communicate directly with the baseband processor 154.

The microphone 172 will typically convert audio input, such as the user's voice, into an electrical signal, which is then digitized and passed directly or indirectly to the baseband processor 154. Audio information encoded in the received signal is recovered by the baseband processor 154 and converted into an analog signal suitable for driving the speaker 174 by the interface circuitry 170. The keypad 176 and the display 178 enable the user to interact with the mobile terminal 144 inputting numbers to be dialed, address book information, or the like, as well as monitoring call progress information.

Figure 12:
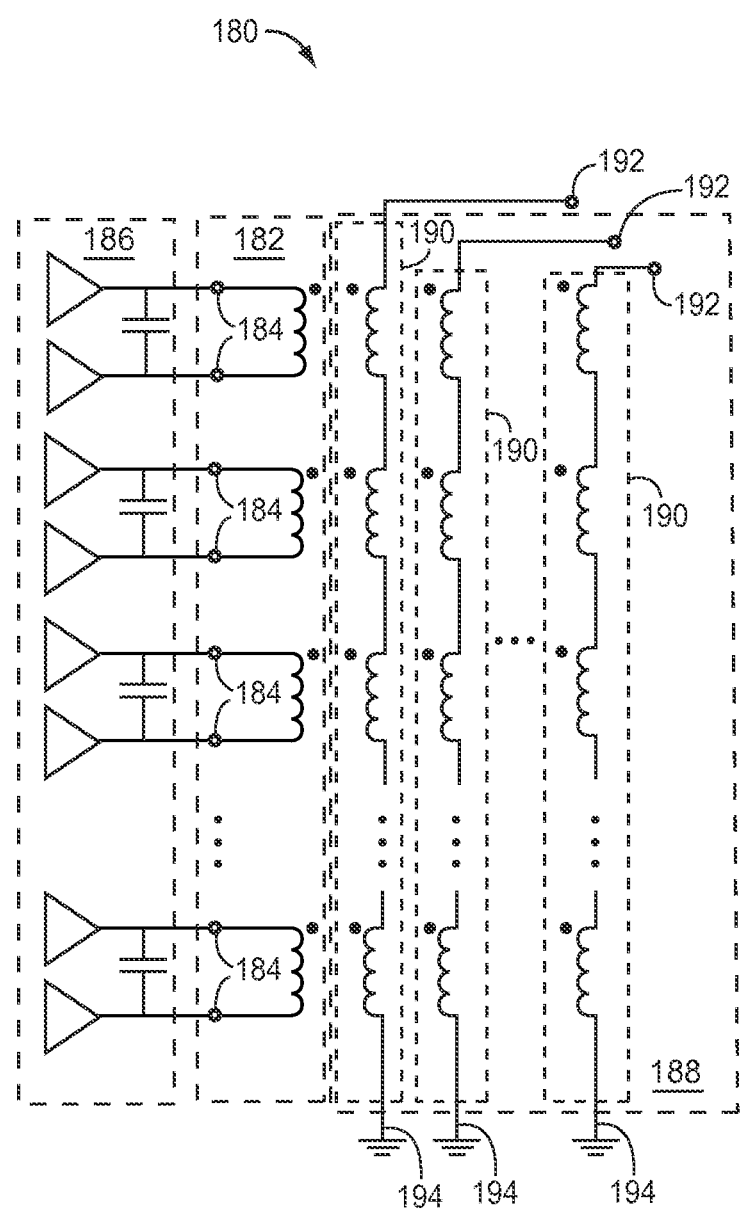
FIG. 12 is a circuit diagram of a broad embodiment of an ATODEM circuit 180 according to the present disclosure.

FIG. 12 is a circuit diagram of a broad embodiment of an ATODEM circuit 180 according to the present disclosure. In FIG. 12, like reference numerals refer to like parts. However, physical attributes of the like parts can be different. The ATODEM circuit 180 includes N input windings 182, wherein N is a natural number. Each of the N input windings have input terminals 184 that couple to output terminals of N PAs 186. The ATODEM circuit 180 further includes M output ports 188 wherein M is a natural number, each of the M output ports 188 having N series coupled windings 190 coupled between a load terminal 192 and a return terminal 194. The return terminal 194 is typically ground. The physical attributes of the N input windings 182, and the N series coupled windings 190 of the M output ports 188 are asymmetrical such that in an Nth operation mode an Nth PA first-load line impedance matches an output impedance of an Nth PA of the N PAs 186 coupled to the input terminals 184.

Those skilled in the art will recognize improvements and modifications to the preferred embodiments of the present disclosure. All such improvements and modifications are considered within the scope of the concepts disclosed herein and the claims that follow.

What is claimed is:

1. An asymmetrical transformer output demultiplexing (ATODEM) circuit comprising:
   a first primary winding having first input terminals;
   a second primary winding having second input terminals;
   series coupled secondary windings having a first load terminal; and
   series coupled tertiary windings having a second load terminal, wherein physical attributes of the first primary winding, the second primary winding, the series coupled secondary windings, and the series coupled tertiary windings are asymmetrical such that in a first operation mode a first PA first load-line impedance matches an output impedance of a first PA coupled to the first input terminals and in a second operation mode a second PA first load-line impedance matches an output impedance of a second PA coupled to the second input terminals.

2. The ATODEM circuit of claim 1 further including a phase alternating circuit that is responsive to a control signal for alternately selecting the first operation mode and the second operation mode.

3. The ATODEM circuit of claim 1 further including a first programmable capacitor array (PAC) coupled between the first load terminal and a first load.

4. The ATODEM circuit of claim 1 further including a second (PAC) coupled between the second load terminal and a second load.

5. The ATODEM circuit of claim 1 wherein the physical attributes are asymmetrical turns-ratios between the first primary winding, the second primary winding, the series coupled secondary windings, and the series coupled tertiary windings.

6. The ATODEM circuit of claim 1 wherein the physical attributes are asymmetrical geometries for traces comprising the first primary winding, the second primary winding, the series coupled secondary windings, and the series coupled tertiary windings.

7. The ATODEM circuit of claim 1 wherein a middle metal layer comprises the first primary winding and the second primary winding is located between a first adjacent metal layer that comprises the series coupled secondary windings and a second adjacent metal layer that comprises the series coupled tertiary windings.

8. The ATODEM circuit of claim 1 wherein the first primary winding, the second primary winding, the series coupled secondary windings, and the series coupled tertiary windings are fabricated in a Silicon-on-insulator (SOI) substrate.

9. The ATODEM circuit of claim 1 wherein the first primary winding, the second primary winding, the series coupled secondary windings, and the series coupled tertiary windings are fabricated in a Gallium Arsenide (GaAs) substrate.

10. The ATODEM circuit of claim 1 wherein the first primary winding, the second primary winding, the series coupled secondary windings, and the series coupled tertiary windings are fabricated in a core or coreless substrate.

11. A mobile terminal comprising:
    a power amplifier (PA) stage having an input and an output;
    a modulator communicably coupled to the input of the PA stage;

an asymmetrical transformer output demultiplexing (ATO-DEM) circuit communicably coupled to the output of the PA stage, comprising:
  a first primary winding having first input terminals;
  a second primary winding having second input terminals;
  series coupled secondary windings having a first load terminal; and
  series coupled tertiary windings having a second load terminal, wherein physical attributes of the first primary winding, the second primary winding, the series coupled secondary windings, and the series coupled tertiary windings are asymmetrical such that in a first operation mode a first PA first load-line impedance matches an output impedance of a first PA of the PA stage coupled to the first input terminals and in a second operation mode a second PA first load-line impedance matches an output impedance of a second PA of the PA stage coupled to the second input terminals.

12. The mobile terminal of claim 11 further including a phase alternating circuit coupled between the modulator and the PA stage, the phase alternating circuit being responsive to a control signal for alternately selecting the first operation mode and the second operation mode.

13. The mobile terminal of claim 11 further including a first PAC coupled between the first load terminal and a first load.

14. The mobile terminal of claim 11 further including a second PAC coupled between the second load terminal and a second load.

15. The mobile terminal of claim 11 wherein the physical attributes are asymmetrical turns-ratios between the first primary winding, the second primary winding, the series coupled secondary windings, and the series coupled tertiary windings.

16. The mobile terminal of claim 11 wherein the physical attributes are asymmetrical geometries for traces comprising the first primary winding, the second primary winding, the series coupled secondary windings, and the series coupled tertiary windings.

17. The mobile terminal of claim 11 wherein a middle metal layer comprises the first primary winding and the second primary winding is located between a first adjacent metal layer that comprises the series coupled secondary windings and a second adjacent metal layer that comprises the series coupled tertiary windings.

18. The mobile terminal of claim 11 wherein the first primary winding, the second primary winding, the series coupled secondary windings, and the series coupled tertiary windings are fabricated in a Silicon-on-insulator (SOI) substrate.

19. The mobile terminal of claim 11 wherein the first primary winding, the second primary winding, the series coupled secondary windings, and the series coupled tertiary windings are fabricated in a Gallium Arsenide (GaAs) substrate.

20. The mobile terminal of claim 11 wherein the first primary winding, the second primary winding, the series coupled secondary windings, and the series coupled tertiary windings are fabricated in a core or coreless substrate.

21. An asymmetrical transformer output demultiplexing (ATODEM) circuit comprising:
  N input windings, each of the N input windings having input terminals, wherein N is a natural number; and
  M output ports wherein M is a natural number, each of the M output ports having N series coupled windings coupled between a load terminal and a ground terminal, wherein physical attributes of the N input windings, and the N series coupled windings of the M output ports are asymmetrical such that in an Nth operation mode an Nth power amplifier (PA) first-load line impedance matches an output impedance of an Nth PA coupled to the input terminals.

22. The ATODEM circuit of claim 21 further including a phase alternating circuit that is responsive to a control signal for selecting the Nth operation mode.

23. The ATODEM circuit of claim 21 further including a first programmable capacitor array (PAC) coupled between an Nth load terminal and an Nth load.

24. The ATODEM circuit of claim 21 wherein the physical attributes are asymmetrical turns-ratios between the N input windings and N series coupled windings of the M output ports.

25. The ATODEM circuit of claim 21 wherein the physical attributes are asymmetrical geometries for traces comprising the N input windings and the N series coupled windings of the M output ports.

* * * * *